United States Patent
Zafarana et al.

(10) Patent No.: US 12,326,478 B2
(45) Date of Patent: Jun. 10, 2025

(54) MULTIPHASE TRANS-INDUCTOR VOLTAGE REGULATOR FAULT DIAGNOSTIC

(71) Applicant: SEMICONDUCTOR COMPONENTS INDUSTRIES, LLC, Phoenix, AZ (US)

(72) Inventors: Alessandro Zafarana, Milan (IT); Salvatore Leone, Milan (IT); Chun-Yen Lin, Taoyuan (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 109 days.

(21) Appl. No.: 17/804,709

(22) Filed: May 31, 2022

(65) Prior Publication Data
US 2023/0194625 A1  Jun. 22, 2023

Related U.S. Application Data

(60) Provisional application No. 63/265,844, filed on Dec. 22, 2021.

(51) Int. Cl.
*G01R 31/40* (2020.01)
*G01R 19/165* (2006.01)
*H02M 7/217* (2006.01)

(52) U.S. Cl.
CPC .......... *G01R 31/40* (2013.01); *G01R 19/165* (2013.01); *H02M 7/217* (2013.01)

(58) Field of Classification Search
CPC ...... G01R 31/40; G01R 19/165; H02M 7/217
See application file for complete search history.

(56) References Cited

U.S. PATENT DOCUMENTS

| | | | |
|---|---|---|---|
| 6,912,144 B1 * | 6/2005 | Clavette | H02M 3/1584 323/283 |
| 7,504,808 B2 * | 3/2009 | Schrom | H02M 7/068 323/272 |

(Continued)

OTHER PUBLICATIONS

"Fast Multi-phase Trans-inductor Voltage Regulator", Technical Disclosure Commons, May 9, 2019, Defensive Publications Series, Art 2190 (2019).

(Continued)

*Primary Examiner* — Lisa M Caputo
*Assistant Examiner* — Sharah Zaab
(74) *Attorney, Agent, or Firm* — Dickinson Wright PLLC; Mark E. Scott

(57) ABSTRACT

Multiphase trans-inductor voltage regulator fault diagnostic. One example is a method of detecting electrical faults in a multiphase power converter, the method comprising: driving, by a controller of the multiphase power converter, a first phase of the power converter, the first phase comprising a phase-one transformer module; driving, by the controller, a second phase of the power converter, the second phase comprising a phase-two transformer module distinct from the phase-one transformer module; testing, by the controller of the multiphase power converter, for a phase-one electrical fault associated with the phase-one transformer module; testing, by the controller, for a phase-two electrical fault associated with the phase-two transformer module; and driving, by the controller, a fault indicator in the presence of a phase-one or phase-two electrical fault.

20 Claims, 8 Drawing Sheets

(56) References Cited

U.S. PATENT DOCUMENTS

| | | | | |
|---|---|---|---|---|
| 9,543,838 B2* | 1/2017 | Babazadeh | ............ | G01R 31/40 |
| 2008/0198525 A1 | 8/2008 | Janssen | | |
| 2008/0246508 A1* | 10/2008 | Wang | ..................... | G01R 31/40 |
| | | | | 324/764.01 |
| 2010/0072824 A1* | 3/2010 | Abolhassani | ........... | H02M 7/49 |
| | | | | 307/82 |
| 2014/0239941 A1* | 8/2014 | Coutelou | ............... | G01R 21/06 |
| | | | | 324/140 R |
| 2019/0326819 A1 | 10/2019 | Fang | | |
| 2020/0286670 A1* | 9/2020 | Sigamani | ................ | H01F 27/28 |

OTHER PUBLICATIONS

"Analysis of Multi-Phase Trans-Inductor Voltage, Regulator with Fast Transient Response for Large Load Current Applications", 2021 IEEE International Symposium on Circuits and Systems ISCAS 978-1-7281-9201.

* cited by examiner

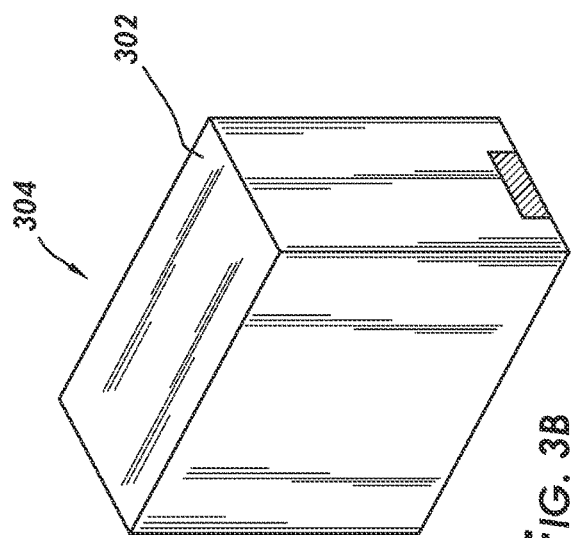
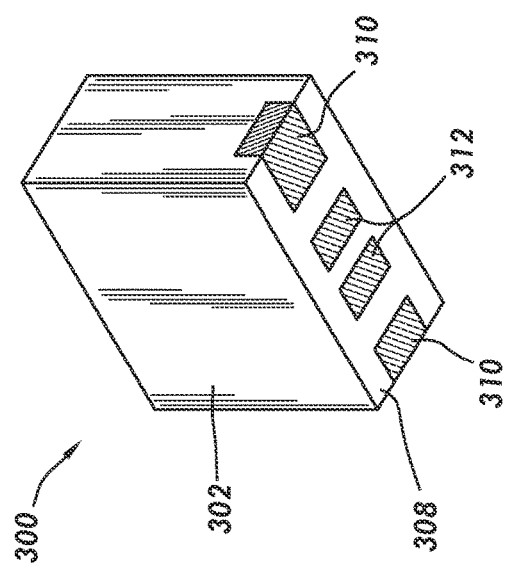
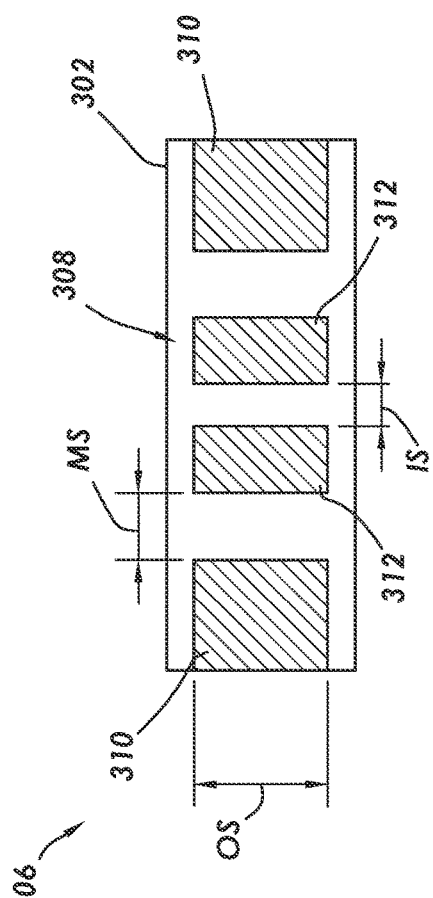
FIG. 3A
FIG. 3B
FIG. 3C

MULTIPHASE TRANS-INDUCTOR VOLTAGE REGULATOR FAULT DIAGNOSTIC

CROSS-REFERENCE TO RELATED APPLICATIONS

This application claims the benefit of U.S. Prov. App. No. 63/265,844 filed Dec. 22, 2021 titled "Multiphase Trans-Inductor Voltage Regulator Fault Diagnostic." The provisional application is incorporated by reference herein as if reproduced in full below.

BACKGROUND

Data centers employ servers and networking hardware that utilize significant electrical current (e.g., a thousand amps). The electrical demand, however, may fluctuate rapidly as the processing load rises and falls within the data center. Related-art data centers use multiphase voltage regulators (VRs) to supply such loads. As loads in data centers are ever-increasing, the industry is shifting toward supplying the electrical demand using multiphase trans-inductance or trans-inductor voltage regulators (TLVRs) in which the inductance for each buck phase is provided by a primary winding of a transformer. Each buck phase has a secondary winding, and the secondary windings are electrically coupled such that overall response to transient loads is faster than the prior multiphase VRs using only standalone inductors as the inductance for each buck phase.

SUMMARY

One example is a method of detecting electrical faults in a multiphase power converter, the method comprising: driving, by a controller of the multiphase power converter, a first phase of the multiphase power converter, the first phase comprising a phase-one transformer module; driving, by the controller, a second phase of the multiphase power converter, the second phase comprising a phase-two transformer module distinct from the phase-one transformer module; testing, by the controller of the multiphase power converter, for a phase-one electrical fault associated with the phase-one transformer module; testing, by the controller, for a phase-two electrical fault associated with the phase-two transformer module; and driving, by the controller, a fault indicator in the presence of a phase-one or phase-two electrical fault.

In the example method, driving the first phase and driving the second phase may further comprise at least one selected from a group consisting of: driving when a voltage output of the multiphase power converter is less than half a rated voltage; and driving when the voltage output is less than a quarter of the rated voltage.

In the example method, testing for the phase-one electrical fault may further comprises analyzing a signal indicative of current during a charge mode of the first phase.

In the example method, driving the first phase and driving the second phase may further comprises driving the first phase and then driving the second phase. Driving the fault indicator may further comprise driving the fault indicator if the testing for the phase-one electrical fault indicates at least one selected from a group consisting of: a primary winding to a secondary winding short circuit; shorting of the secondary winding; and an open circuit on a primary side of the phase-one transformer module.

In the example method, driving the first phase and driving the second phase may further comprises driving the first phase and simultaneously driving the second phase. Driving the fault indicator may further comprise driving the fault indicator if the testing for the phase-one electrical fault or the testing for the phase-two electrical fault indicate an open circuit on a secondary side of either the phase-one or phase-two transformer modules.

Another example is a controller for power converter, the controller comprising: a phase-one drive terminal, a phase-one monitor terminal, a phase-two drive terminal, a phase-two monitor terminal, and a fault terminal; a fault logic coupled to the phase-one drive terminal, the phase-one monitor terminal, the phase-two drive terminal, the phase-two monitor terminal, and the fault terminal. The fault logic may be configured to: assert the phase-one drive terminal; sense a phase-one signal indicative of current by way of the a phase-one monitor terminal; assert the phase-two drive terminal; sense a phase-two signal indicative of current by way of the phase-two monitor terminal; detect an electrical fault associated with a phase-one transformer module associated with the phase-one drive terminal, the detection based on the phase-one signal indicative of current; and drive a fault indicator to the fault terminal.

In the example controller, when the fault logic detects the electrical fault, the controller may be configured to at least one selected from a group consisting of: detect when a voltage output of the power converter is less than half a rated voltage; and detect when the voltage output is less than a quarter of the rated voltage.

In the example controller, when the fault logic senses the phase-one signal indicative of current, the controller may be further configured to sense the phase-one signal indicative of current during a charge mode of a first phase of the power converter.

In the example controller, when the fault logic asserts the phase-one drive terminal and the phase-two drive terminal, the controller may be further configured to assert the phase-one drive terminal and then assert the phase-two drive terminal. When the fault logic drives the fault indicator, the controller may be further configured to drive the fault indicator when the controller detects at least one selected from a group consisting of: a misplacement of the phase-one transformer module resulting in a short circuit between a phase-one primary winding and a phase-one secondary winding; a misplacement of the phase-one transformer module resulting in a short circuit across the phase-one secondary winding; and an incomplete solder joint resulting in an open circuit associate with a phase-one primary winding.

In the example controller, when the fault logic asserts the phase-one drive terminal and the phase-two drive terminal, the controller may be further configured to assert the phase-one drive terminal and simultaneously assert the phase-two drive terminal. When the fault logic drives the fault indicator, the controller may be further configured to drive the fault indicator if the controller detects an open circuit on a phase-one secondary of the phase-one transformer module.

Yet another example is a power converter comprising: a first phase; a second phase; and a controller. The first phase may comprise: a phase-one transformer defining phase-one primary winding and a phase-one secondary winding; a phase-one charge FET defining a drain, a source, and a gate, the drain coupled to an input voltage, and the source coupled to a first lead of the phase-one primary winding; and a phase-one discharge FET defining a drain, a source, and a gate, the drain of the phase-one discharge FET coupled to the first lead, and the source of the phase-one charge FET coupled to a reference voltage. The second phase may comprise: a phase-two transformer defining a phase-two primary winding and a phase-two secondary winding; a phase-two charge FET defining a drain, a source, and a gate, the drain of the phase-two charge FET coupled to the input voltage, and the source of the phase-two charge FET coupled to a first lead of the phase-two primary winding; a phase-two discharge FET defining a drain, a source, and a gate, the drain of the phase-two discharge FET coupled to the first lead of the phase-two primary winding, and the source of the phase-two discharge FET coupled to the reference voltage; an inductor coupled in series with the phase-one secondary winding, and the phase-one secondary winding coupled in series with the phase-two secondary winding; and a voltage output defined by second leads of the phase-one and phase-two primary windings. The controller may comprise: a phase-one output coupled to the gate of the phase-one charge FET and the gate of the phase-one discharge FET; and a phase-two output coupled to the gate of the phase-two charge FET and the gate of the phase-two discharge FET. The controller may be configured to assert the phase-one output and the phase-two output, and detect misplacement of the phase-one transformer or the phase-two transformer, and drive a fault indicator if the phase-one or the phase-two transformer is misplaced.

In the example power converter, when the controller detects misplacement of the phase-one transformer or the phase-two transformer, the controller may be further configured to detect before the voltage output reaches a rated voltage.

In the example power converter, when the controller asserts the phase-one output and the phase-two output, the controller may be further configured to assert the phase-one output and then assert the phase-two output. When the controller detects misplacement of the phase-one transformer, the controller may be configured to detect during the assertion of the phase-one output; and when the controller detects misplacement of the phase-two transformer, the controller may be configured to detect during the assertion of the phase-two output. When the controller drives the fault indicator, the controller may be further configured to drive the fault indicator if the controller detects misplacement being at least one selected from a group consisting of: the phase-one primary winding directly coupled to the phase-one secondary winding; and shorting of the phase-one secondary winding.

In the example power converter, the controller may be further configured to: assert the phase-one output and simultaneously assert the phase-two output; drive the fault indicator upon detection of an incomplete solder joint associated with the phase-one transformer or the phase-two transformer.

BRIEF DESCRIPTION OF THE DRAWINGS

For a detailed description of example embodiments, reference will now be made to the accompanying drawings in which:

FIGS. 3A, 3B, and 3C show a bottom perspective view, a top perspective view, and a bottom elevation view, respectively, of an example transformer module;

DEFINITIONS

Figure 1:
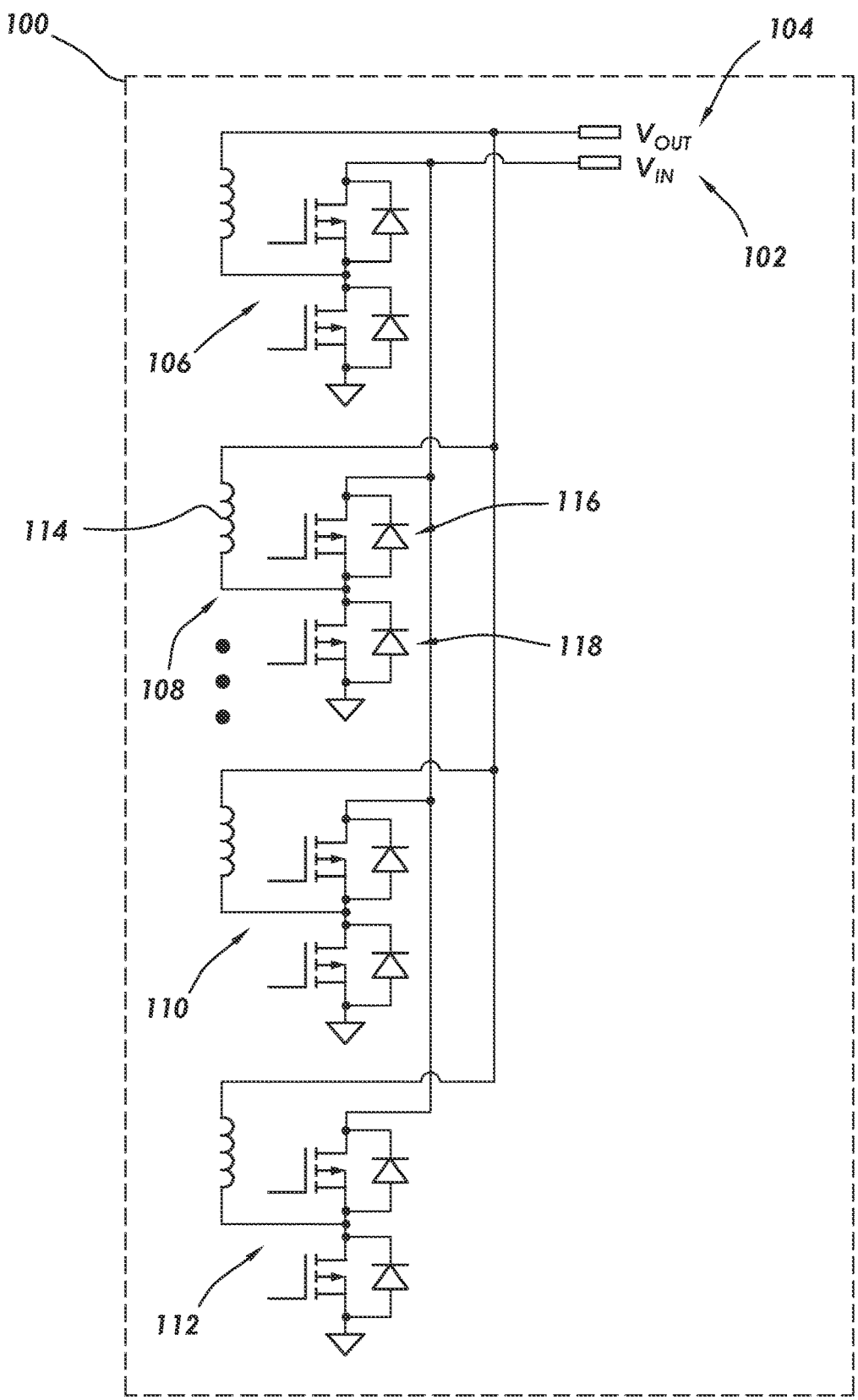
FIG. 1 shows a partial electrical schematic of a related-art multiphase voltage regulator.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Assert" shall mean changing the state of a binary or Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Controller" shall mean, alone or in combination, individual circuit components, an application specific integrated circuit (ASIC), a microcontroller with controlling software, a reduced-instruction-set computing (RISC) with controlling software, a digital signal processor (DSP), a processor with controlling software, a programmable logic device (PLD), or a field programmable gate array (FPGA), configured to read inputs and drive outputs responsive to the inputs. Stated otherwise, the controller may be an integrated circuit that receives the controller state variables (all the buck inductor currents and the output voltage) and produces the Boolean driving signals (e.g., pulse-width modulation (PWM) signals) to control the output voltage in steady state and transient conditions (transients for load current, input voltage, processor voltage scaling), to control the current distribution among phases, and to control the interleaving phase shift in steady state to reduce the voltage output $V_{OUT}$ ripple.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to fault diagnostics in multiphase trans-inductor voltage regulators (TLVRs). More particularly, various examples are directed to detecting electrical faults (e.g., component misplacement, cold solder joints) in the assembly of voltage regulators implemented as TLVRs. More particularly still, various examples are directed to detecting electrical faults by a controller designed and constructed to control phases or phase nodes of a multiphase TLVR, the detection of electrical faults by analysis of values indicative of current through the primary winding of each phase. More particularly still, various examples are directed to detecting electrical faults using only values indicative of current through the primary winding of each phase during charge modes.

Stated differently, various examples are directed to multiphase TLVR fault diagnostics. The fault diagnostics detect electrical faults (e.g., electrical shorts, open circuits) associated with mis-location or misplacement of a transformer module relative to an underlying printed circuit board (PCB), and "cold" or incomplete solder joints between the transformer module and the underlying PCB, where the transformer module implements the trans-inductor for a phase of a multiphase TLVR. In example cases, the fault diagnostics may be based on use of sets of overcurrent detection or overcurrent protection comparators—OCP_L and OCP_H—one set of comparators associated with each phase of the multiphase voltage regulator. The fault diagnostics may be active at soft start of the voltage regulator (e.g., as voltage on the voltage output rises from zero, but before reaching rated voltage). In example cases, the detection of the electrical fault associated with a phase occurs using one or both of comparators and a stimulus, such as a parallel stimulus of the all the phases (e.g. all the phases in the charge mode simultaneously) or an interleaved stimulus (e.g., each phase activated sequentially). Each set of comparators may implement two thresholds and thus define three detection regions to identify electrical fault cases. The example diagnostic method may identify a single electrical fault of a TLVR component and the combined fault of the TLVR and terminating inductor on the secondary side (e.g., inductor Lc 226 of FIG. 2).

The example diagnostic method may operate without measuring the alternating current (AC) part of the phase current (e.g., the ripple). The example diagnostic method may operate without measuring or vetting the system stability (e.g., testing and measuring phase margin). The example diagnostic method may operate without measuring any signal on the secondary sides of the transformers implementing the trans-inductors. The example systems may use industry standard pinouts for the controller of the voltage regulator and the power stage modules (e.g., the integrated circuit implementing the phase switches)—the example diagnostic does not require an additional pin added to the controller or an additional pin added to each power stage module. The example diagnostic method does not require the customer to design or perform in-circuit tests (ICTs) within the manufacturing line. The example diagnostic method may be implemented without the customer adding or designing additional circuitry to accompany the controller to detect one or all the electrical faults associated with the transformer modules. That is, the fault detection is a mechanism agnostic to the customer's design. The example diagnostic method is not specifically related to any control method or DC-DC converter modulator technique. The specification now turns to a related-art multiphase voltage regulator to orient the reader.

FIG. 1 shows a partial electrical schematic of a related-art multiphase voltage regulator. In particular, FIG. 1 shows a voltage regulator 100 comprising a voltage input $V_{IN}$ 102, a voltage output $V_{OUT}$ 104, and a plurality of buck stages 106, 108, 110, and 112. Referring to buck stage 108 as representative of each buck stage, buck stage 108 is implemented using an inductor 114 and a set of electrically-controlled switches (hereafter just switches, and illustratively shown as field-effect transistors (FETs)). When the example buck stage 108 is in the charge mode, the upper switch 116 is conductive, coupling the voltage input $V_{IN}$ 102 to the inductor 114, and the "lower" switch 118 is non-conductive. During the charge mode the field around the inductor 114 is charged and thus stores energy. During an example discharge mode, the lower switch 118 is conductive and the upper switch 116 is non-conductive, and the energy stored in the field of the inductor collapses to provide the voltage output $V_{OUT}$ 104 and the output current. However, as the electrical current demand of severs and data communication equipment is ever increasing, voltage regulators such as shown in FIG. 1 are reaching their operational limits, particularly as it relates to handling transient loads. The specification now turns to an example multiphase TLVR.

Figure 2:
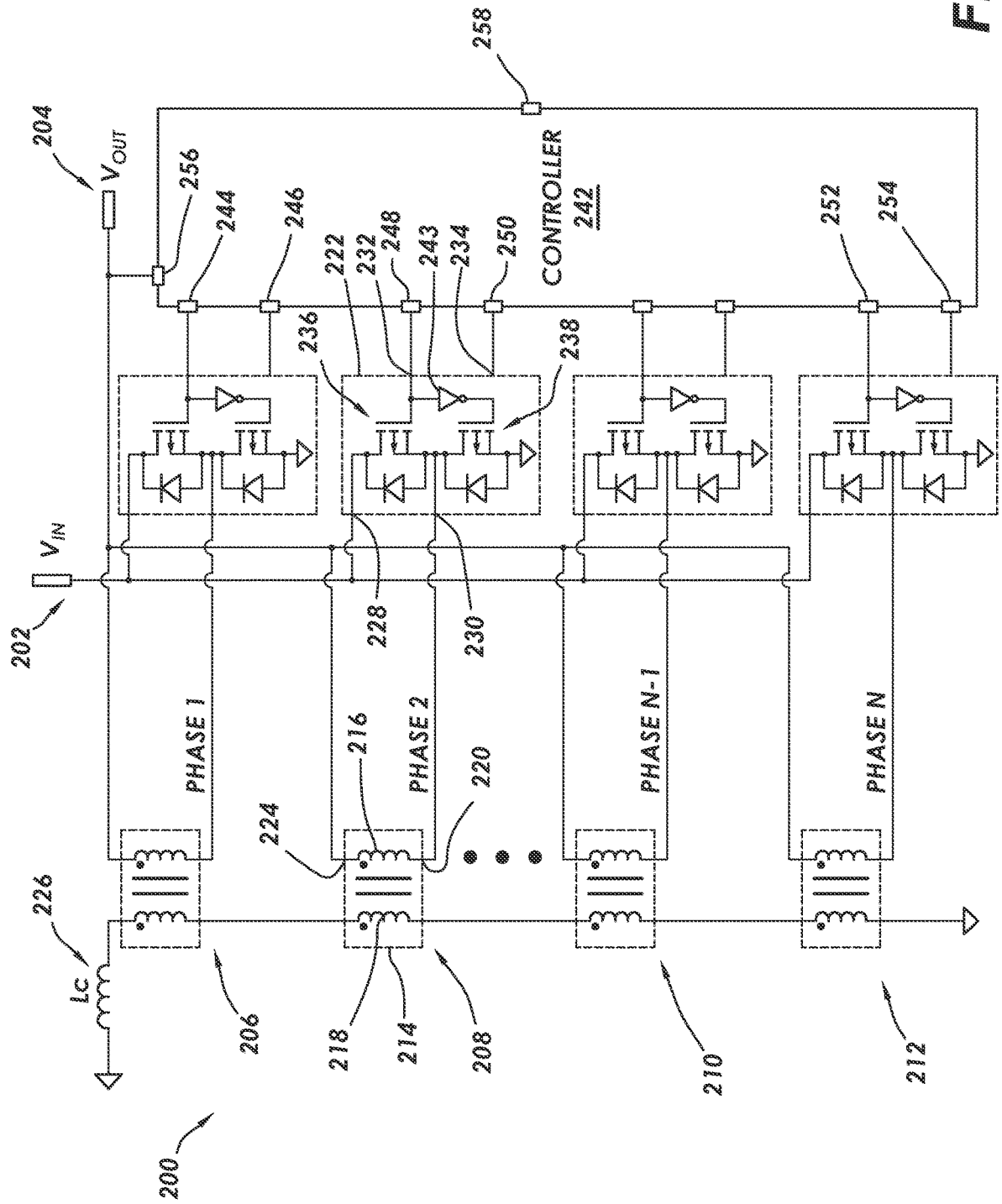
FIG. 2 shows a partial electrical schematic of a multiphase trans-inductance voltage regulator.

FIG. 2 shows a partial electrical schematic, partial block diagram, of an example multiphase trans-inductor voltage regulator (i.e., a multiphase TLVR 200). In particular, the example multiphase TLVR 200 comprises a voltage input $V_{IN}$ 202, a voltage output $V_{OUT}$ 204, and a plurality of buck stages 206, 208, 210, and 212. While four buck stages are shown, the multiphase TLVR 200 may comprise two or more buck stages (e.g., four, five, six, eight, or ten). Referring to buck stage 208 as representative of all the buck stages, the example buck stage 208 implements an inductance in the form a transformer 214. The example transformer 214 comprises a primary side with a primary winding 216 a secondary side with a secondary winding 218. The primary winding 216 defines a first lead 220 coupled to a power stage module 222, and a second lead 224 coupled to and defining the voltage output $V_{OUT}$ 204. The secondary winding 218 of the transformer 214 is coupled in series with a secondary-side inductance Lc 226 as well as the secondary windings of the transformers from the other buck stages of the multiphase TLVR 200.

The example power stage module 222 defines a power input 228 coupled to the voltage input $V_{IN}$ 202, a drive output 230 coupled to the first lead 220, a PWM input 232, and a monitor output 234. FIG. 2 further shows a simplified internal electrical schematic of the example power stage module 222. In particular, the example power stage module 222 comprises a set of electrically-controlled switches, illustratively shown as FETs, and hereafter just switches. In particular, the representative power stage module 222 comprises an upper or charge switch 236 and a lower or discharge switch 238. The drain of the charge switch 236 defines the power input 228, and thus the drain of the charge switch 236 is coupled to the voltage input $V_{IN}$ 202. The source of the charge switch 236 defines the drive output 230 and thus is coupled to the first lead 220 of the transformer 214. The gate of the charge switch 236 defines the PWM input 232. Further in the example power stage module 222, the drain of the discharge switch 238 is coupled to the source of the charge switch 236, and thus the drain of the discharge switch 238 is also coupled to the first lead 220 of the transformer 214. The source of the discharge switch 238 is coupled to a reference voltage of the multiphase TLVR (e.g., ground, common). The gate of the discharge switch 238 is coupled to the PWM input 232 by way of a logic NOT gate 243. Thus, the discharge switch 238 is conductive oppositely from conductive periods of the charge switch 236. More particularly, assertion of the PWM input 232 makes the charge switch 236 conductive and the discharge switch 238 non-conductive. When the charge switch 236 is conductive, the voltage input $V_{IN}$ 202 drives current through the charge switch 236 and the primary winding 216 of the transformer 214, storing energy in the field of the transformer 214 (i.e., the charge mode). Further, de-assertion of the PWM input 232 makes the charge switch 236 non-conductive and the discharge switch 238 conductive. When the discharge switch 238 is conductive, the field associated with the primary winding 216 collapses, providing voltage and current to the voltage output $V_{OUT}$ 204 (i.e., the discharge mode).

The example power stage module 222 further defines the monitor output 234. In example cases, the power stage module 222 creates a signal indicative of current flowing during each charge mode. That is, the power stage module 222 is designed and constructed to produce the signal indicative of current flowing through the charge switch 236 when the charge switch 236 is conductive. The physical manifestation of creating the signal indicative of current is not shown in FIG. 2, but may take any suitable form (e.g., a sense-FET associated with the charge switch 236, a current transformer, a low resistance shunt resistor). In example cases, each power stage module 222 may be a part number FDMF5701 or FDMD58xx Smart Power Stage (SPS) Module available from ON Semiconductor of Phoenix, Arizona.

Still referring to FIG. 2, in the multiphase TLVR 200 the inductance within each buck stage is provided by its respective transformer (e.g., the magnetizing inductance, and to a lesser extent the leakage inductance). The secondary winding of each transformer is coupled in series with the other secondary windings and the secondary-side inductance Lc 226. In steady state, the operation of the multiphase TLVR 200 closely matches the multiphase voltage regulator of FIG. 1. However, the multiphase TLVR 200 has substantially better response to transient loads. In particular, transient loads in the form of transient currents in each buck phase cause a responsive transient current in the associated secondary winding. Because of the loop structure of the secondary side (e.g., through the second-side inductance Lc 226 and the ground or common connections), responsive transient current affects all the remaining stages. For example, if the transient current is a current spike in the active phase (e.g., the buck phase in the charge mode), the responsive transient current on the secondary winding causes additional current to flow in the primary windings of all the remaining phases (e.g., all the remaining stages in their respective discharge modes). The result is better voltage control in transient load situations than voltage regulators such as FIG. 1.

The example multiphase TLVR 200 further comprises a controller 242. The example controller 242 defines multiple sets of terminals comprising a drive terminal and a monitor terminal, one set each for each buck stage of the multiphase TLVR 200. For example, the controller 242 defines: a phase-one drive terminal 244 and a phase-one monitor terminal 246; a phase-two drive terminal 248 and a phase-two monitor terminal 250; and a phase-N drive terminal 252 and a phase-N monitor terminal 254. Referring again to buck stage 208 as representative, the phase-two drive terminal 248 is coupled to the PWM input 232 of the power stage module 222, and the phase-two monitor terminal 250 is coupled to the monitor output 234 of the power stage module 222. Thus, in operation the controller 242 asserts the phase-two drive terminal 248 each time the controller 242 puts the representative buck phase 208 into the charge mode. In example cases, the controller 242 monitors current flow during the charge mode by receiving the signal indicative of current by way of the phase-two monitor terminal 250. The controller 242 then de-asserts the phase-two drive terminal 248 to end the charge mode, which makes the example charge switch 236 non-conductive and makes the example discharge switch 238 conductive.

Still referring to FIG. 2, the example controller 242 further defines a feedback terminal 256 and a fault terminal 258. Additional terminals will be present (e.g., enable terminal, power terminal, and ground terminal), but the additional terminals are not shown so as not to unduly complicate the figure. The example feedback terminal 256 is coupled to the voltage output $V_{OUT}$ 204. While the feedback terminal 256 is shown directly coupled to the voltage output $V_{OUT}$ 204, in other cases the feedback voltage may be scaled (e.g., using a voltage divider). The example controller 242 may set the pulse width of the drive signal applied to each drive terminal based on the feedback voltage sensed on the feedback terminal 256. The example fault terminal 258 may be used when the fault diagnostics, discussed more below, find an electrical fault during the diagnostic testing. In one example, the fault signal driven to the fault terminal 258 is a Boolean signal that is asserted when an electrical fault is detected. Downstream devices, such as a baseboard management controller (not specifically shown), managing all the multiphase TLVRs for a server rack, may receive the Boolean signal and act accordingly. In other cases, the fault terminal 258 may be a communication terminal of a communication protocol, such as a serial communication protocol. Thus, when one or more electrical faults are detected by the controller 242, the controller 242 may communicate an identity of the electrical fault(s) to the baseboard management controller by way of the fault terminal 258. Thus, "asserting" the fault terminal in the presence of an electrical fault shall include not only a Boolean assertion, but also sending serial messages by way of the fault terminal 258 indicating and possibly identifying any such electrical faults.

The transformers to provide the trans-inductance of FIG. 2 are relatively small packaged devices, referred to as transformer modules. The transformer modules are designed and constructed for soldering to an underlying PCB using a pick-and-place robotic system. FIG. 3A shows a bottom perspective view 300 of an example transformer module 302, FIG. 3B shows a side perspective view 304 of the example transformer module 302, and FIG. 3C shows a bottom elevation view 306 of the example transformer module 302 on the bottom middle of the figure. In particular, the example transformer module 302 contains within its packaging a primary winding (not visible), a secondary winding (not visible), and a magnetic material (not visible). The magnetic material magnetically couples the primary winding to the secondary winding. The leads for the primary winding and the secondary winding are electrically accessible on the bottom 308 of the transformer module 302 by way of solder pads. In example cases, the outer solder pads 310 define the first lead and the second lead of the primary winding (e.g., primary winding 216 of FIG. 2). The inner solder pads 312 define the first lead and the second lead of the secondary winding (e.g., secondary winding 218 of FIG. 2).

In order to get a sense of scale, FIG. 3C shows the bottom elevation view 306. It is noted that the drawings of FIG. 3A-C are not necessarily to scale, and moreover the bottom elevation view 306 is magnified in size. Visible in the bottom elevation view 306 are the solder pads to show relative size and spacing. In the example transformer module 302, the outer solder pads 310 are squares with sides having lengths OS of about 3.1 millimeters (mm). The inner solder pads 312 are rectangles with long sides having lengths of about the same as the outer solder pads (e.g., about 3.1 mm) and short sides (not specifically marked in FIG. 3C) having lengths of about half the length of the long sides (e.g., short side lengths about 1.5 mm). The spacing IS between the inner solder pads 312 may be as small as 1 mm. The spacing MS between each outer solder pad 310 and its nearest-neighbor inner solder pad 312 may be about half the length of the long sides of the outer solder pads 312 (e.g., MS being about 1.5 mm). It follows from the placement of the solder pads 310 and 312 on the example transformer module 302 that the underlying PCB will have corresponding solder pads with corresponding placement and spacing.

One issue with using transformer modules such as shown in FIG. 3A-C is the potential for mis-location or misplacement of the transformer module during assembly. If the transformer module is shifted or misplaced by one millimeter or more in the long direction of the transformer module 302, various undesirable direct electrical connections or electrical short circuits (hereafter just "shorts") may occur with respect to the particular phase within which the transformer module 302 resides. Additionally, if the underlying PCB is shifted or misplaced by one millimeter or more in the long direction of the solder pads, again various electrical shorts may occur with respect to the particular phase within which the transformer module 302 resides. Further still, misplacement of the transformer module by 0.5 mm or more in combination with misplacement of the underlying PCB in the opposite direction by 0.5 mm or more can again cause various electrical shorts. The specification now turns to an explanation of the various electrical shorts based on misplacement of the transformer module and/or the underlying PCB, as well as electrical faults that may be caused by improper or incomplete soldering of the transformer module 302 to the underlying PCB.

Figure 4A:
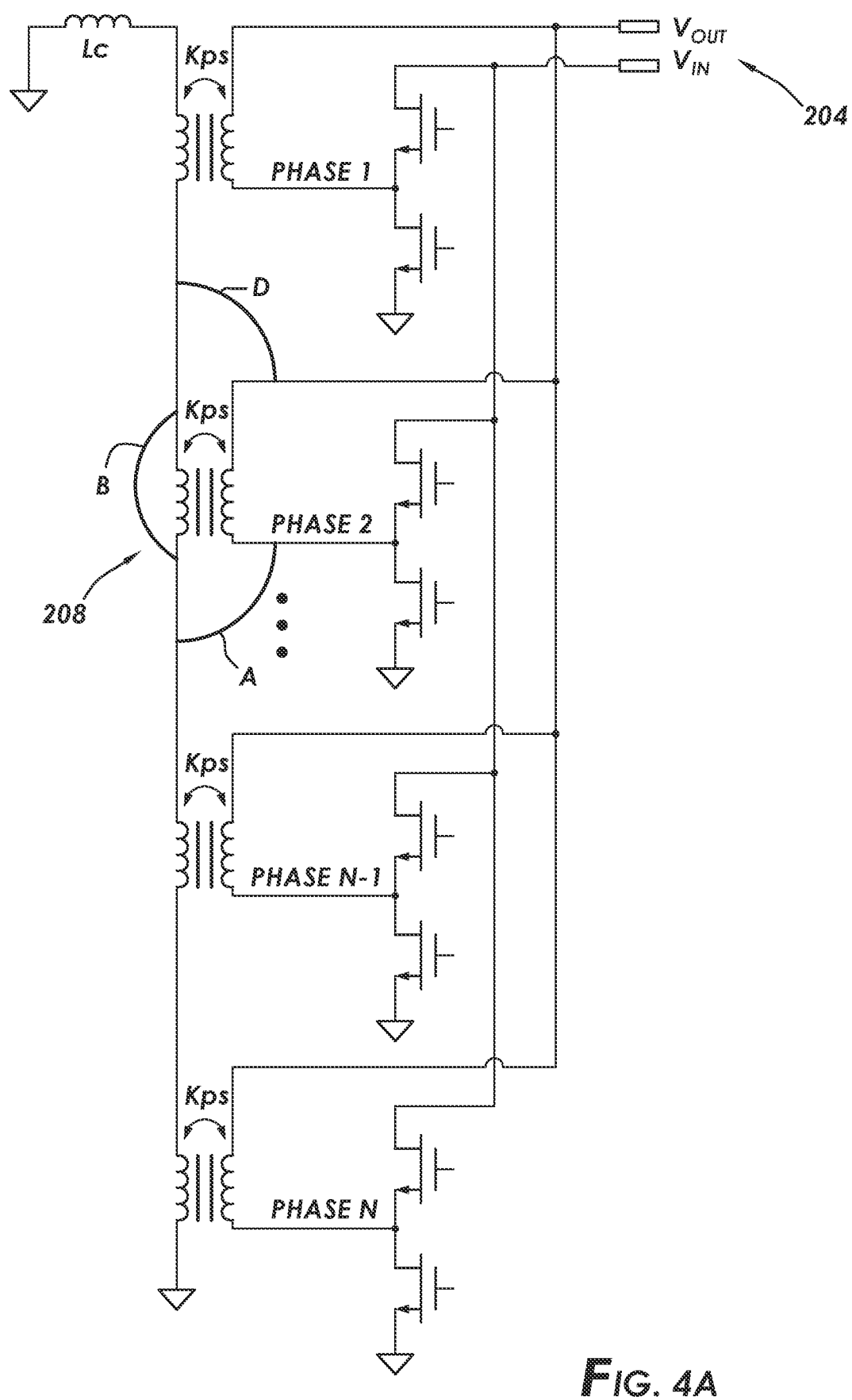
FIGS. 4A and 4B show simplified electrical schematics of two identical multiphase TLVRs to show example electrical faults that may be caused by misplacement of the transformer module and/or the underlying PCB.
Figure 4B:
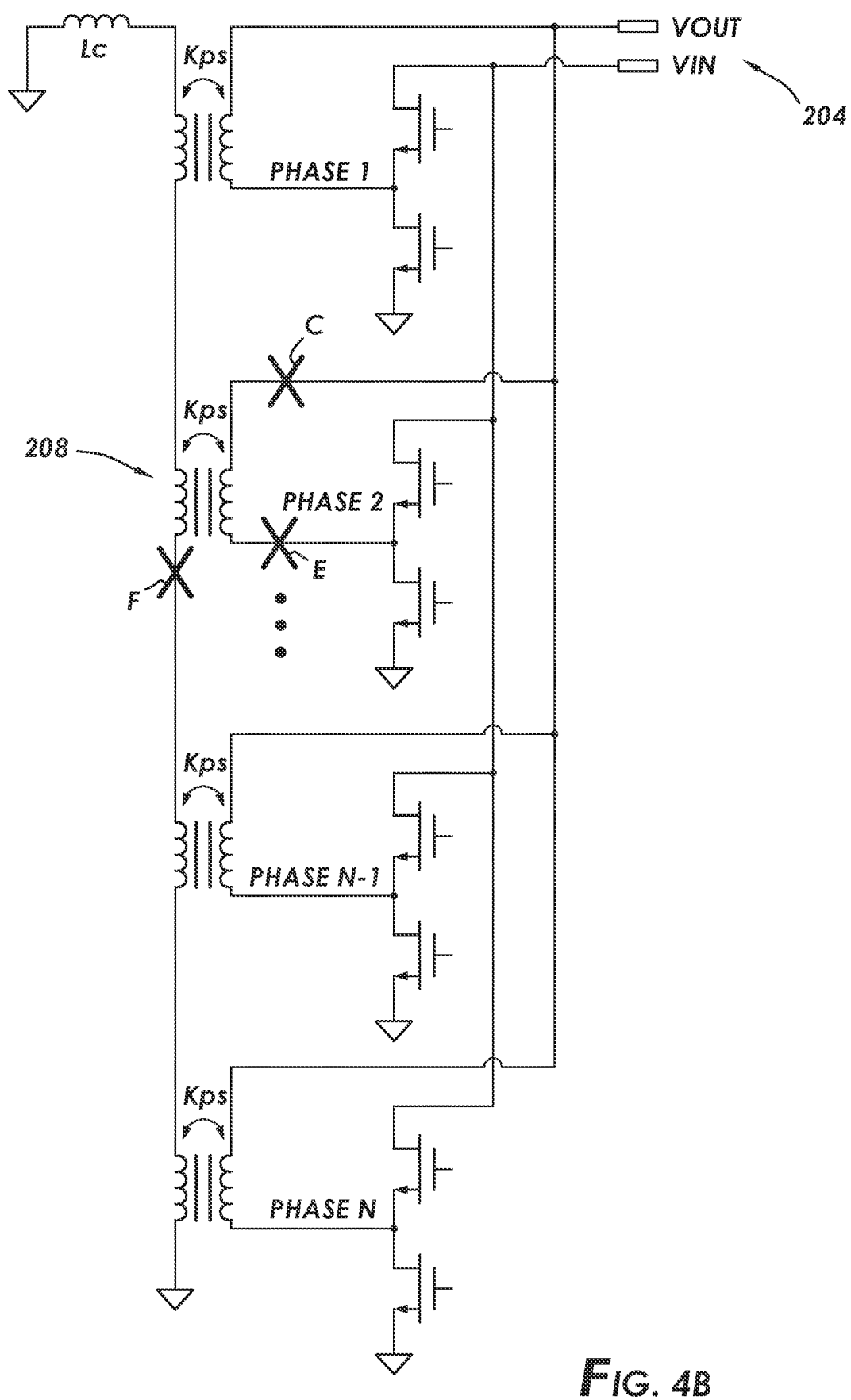

FIGS. 4A and 4B show simplified electrical schematics of two identical multiphase TLVRs to show example electrical faults that may be caused by misplacement of the transformer module, misplacement of the underlying PCB, and/or soldering issues. In particular, the multiphase TLVR of FIG. 4A shows possible electrical shorts caused by misplacement of the transformer module and/or misplacement of the underlying PCB. The multiphase TLVR of FIG. 4B_shows possible electrical opens (i.e., the lack of electrical connection, or very high resistance connections) caused by misplacement and/or soldering issues. Moreover, all the possible electrical faults are shown with respect to the representative buck phase 208, but it will be understood that the electrical faults may occur on any of the buck phases, and indeed multiple phases of a singular multiphase TLVR may have electrical faults.

A concern related to electrical faults of a multiphase TLVR is fault detection. That is, a multiphase TLVR with one or more phases having an electrical fault may startup and regulate the voltage output $V_{OUT}$ 204 sufficiently in the absence of large load transients. However, as the load experiences large transients, the voltage output $V_{OUT}$ 204 may not remain within nominal limits, causing downstream processor failures because of electrical violation of the voltage output $V_{OUT}$ 204 limits (e.g., Case F discussed below), reliability issues of the processor (e.g., Case B discussed below because of excessive voltage ripple), or overall reliability issues (e.g., uneven thermal and current distribution among buck phases).

Referring initially to FIG. 4A, the first electrical fault of interest is referred as Case A primary-to-secondary short. The example Case A primary-to-secondary short may occur when the transformer module is shifted relative to the underlying PCB such that an inner solder pad of the transformer module spans the gap between an inner solder pad and an outer solder pad of the underlying PCB. The fact that the Case A primary-to-secondary short has occurred may not be apparent upon a visual inspection of the transformer module assembled with the underlying PCB. Moreover, once the multiphase TLVR is in operation, the multiphase TLVR may operate sufficiently well that the primary-to-secondary short of the particular phase may not be noticeable. To this point, the DC resistance a multiphase TLVR on the secondary side (i.e., from the short to either ground) is in a range of about 0.5 milli-Ohm (mOhm) to about 1 mOhm. In many cases the peak operating current of the converter is 600 Amps (A) using 8 phases with voltage output $V_{OUT}$ of 1.8V. In example cases, the multiphase TLVR implements short circuit protection at a current flow about 50% higher than the peak operating current, so for a peak operating current of 600 A the short circuit protection activates at 900 A. It follows, the short circuit resistance of a load that results in pulling 900 A is 1.8V/900 A or 2 mOhm. The total resistance on the secondary side of all the multiphase TLVR might be 8×0.5 mOhm=4 mOhm. This means that a Case A primary-to-secondary short (and similarly the Case D primary-to-secondary short, discussed below) will not be detected as a short circuit event.

The next electrical fault of interest is referred as a Case B secondary short. The example Case B secondary short may occur when the transformer module is shifted relative to the underlying PCB such that an inner solder pad of the transformer module spans the gap between the inner solder pads defined by the underlying PCB. With the secondary winding of the trans-inductor shorted, the primary winding experience only leakage inductance, and thus the buck phase tends to carry much higher current during the charge mode, and very little current during the discharge mode. As with all the electrical faults, the fact that the Case B secondary short occurred may not be apparent upon a visual inspection. Moreover, once the multiphase TLVR is in operation, the overall multiphase TLVR may operate sufficiently well that the secondary short of the particular buck phase may not be noticeable until a large load transient (in which case the voltage output $V_{OUT}$ 204 may not be sufficiently maintained).

Referring to FIG. 4B. The next electrical fault of interest is referred to as Case C disconnected or Case C phase open. The example Case C phase open may occur when a solder issue (e.g., a high resistance or "cold" solder joint) fails to electrically connect one of the leads of the primary winding of the transformer module to the underlying PCB. As with all the electrical faults, the fact that the Case C phase open occurred may not be apparent upon a visual inspection. Moreover, once the multiphase TLVR is in operation, the overall multiphase TLVR may operate sufficiently well without the contribution of the open buck phase and thus may not be noticeable until a large load transient occurs (in which case the output voltage $V_{OUT}$ may not be sufficiently maintained).

Referring again to FIG. 4A. The next electrical fault of interest is referred as a Case D primary-to-secondary short. The example Case D primary-to-secondary short may occur when the transformer module is shifted relative to the underlying PCB such that an inner solder pad of the transformer module spans the gap between an inner solder pad and an outer solder pad of the underlying PCB, in this case the shifting in a direction opposite of the Case A primary-to-secondary short. As with all the electrical faults, the fact that the Case D primary-to-secondary short occurred may not be apparent upon a visual inspection. Moreover, once the multiphase TLVR is in operation, the overall multiphase TLVR may operate sufficiently well that the primary-to-secondary short of the particular phase may not be noticeable until a large load transient occurs (in which case the output voltage $V_{OUT}$ may not be sufficiently maintained).

Referring to FIG. 4B, the next electrical fault of interest is referred to as Case E disconnected or Case E phase open. The example Case E phase open may occur when a solder issue fails to electrically connect one of the leads of the primary winding of the transformer module to the underlying PCB. As with all the electrical faults, the fact that the Case E phase open occurred may not be apparent upon a visual inspection. Moreover, once the multiphase TLVR is in operation, the overall multiphase TLVR may operate sufficiently well without the contribution of the open phase and thus may not be noticeable until a large load transient occurs (in which case the output voltage $V_{OUT}$ may not be sufficiently maintained).

The final electrical fault of interest is referred as a Case F disconnected or a Case F secondary open. The example Case F secondary open may occur when a solder issue fails to electrically connect one of the leads of the secondary winding of the transformer module to the underlying PCB. As with all the electrical faults, the fact that the Case F secondary open occurred may not be apparent upon a visual inspection. Moreover, once the multiphase TLVR is in operation, the overall multiphase TLVR may operate sufficiently well without the contribution secondary windings until a large load transient occurs (in which case the output voltage $V_{OUT}$ may not be sufficiently maintained during the load transients). In effect, in the presence of a Case F secondary open, the multiphase TLVR loses the benefit of the transient response provided by the series secondary connections. However, since the output capacitances (not specifically shown) are not tuned for slower transient performance, during transient loads the voltage output $V_{OUT}$ 204 may not be sufficiently maintained. Stated otherwise, the Case F secondary open may make the voltage regulation unstable.

It may be possible for a manufacturer assembling a multiphase TLVR to test for the presence of each of the noted electrical faults using a testing system external to the multiphase TLVR itself. For example, the manufacturer may operate the multiphase TLVR to provide power to a dummy load, while monitoring the multiphase TLVR with an infrared camera. The Case A and Case D primary-to-secondary shorts may manifest themselves as higher temperature zones (i.e., "hot spots") within the multiphase TLVR, the hot spots caused by high currents flowing through the electrical shorts. The Case B secondary shorts may likewise manifest themselves as hot spots within the multiphase TLVR, again the hot spots caused by high currents flowing through the electrical shorts. As an alternative, the Case B secondary short may manifest itself electrically by the presence of a large ripple on the voltage output $V_{OUT}$ 204. The Case C and Case E phase opens may manifest themselves as lower temperature zones (i.e., "cold spots") based on the non-use of each buck phase that is effectively disabled by the phase open. In yet still other cases, the manufacturer may set up ICTs in the manufacturing line to test for proper electrical connections prior to initial power-on the multiphase TLVR. Such ICTs require specialized probe stations and probe equipment.

Returning to FIG. 2. In contrast to thermal inspections and/or ICTs, in various examples the controller 242 is designed and constructed to detect electrical faults (e.g., misplacement, solder issues) of one or more transformer modules. In particular, in example systems the controller 242 may, for example, drive each phase of the multiphase TLVR 200 into a charge mode, and test for electrical faults associated with each phase during each respective charge mode. When a fault is detected, the controller 242 may drive a fault indicator to the fault terminal 258, such as asserting a Boolean signal and/or initiating communicating over the fault terminal 258. In example cases, driving each phase of the power converter may involve asserting the PWM input of each phase (e.g., PWM input 232 of power stage module 222) to place each respective phase in a charge mode. During the charge mode of each phase, the controller 242 may sense a signal indicative of current, the sensing by way of the monitor output of each phase (e.g., monitor output 234). Based on the signal indicative of current for each phase, the controller 242 may detect one or more electrical faults associated with the transformer modules of the multiphase TLVR 200.

In example cases, the controller 242 drives each phase and performs the testing and detection during soft start of the multiphase TLVR 200. In particular, in example cases the controller 242 drives each phase by asserting each drive terminal (e.g., drive terminal 248) and tests for and/or detects the electrical fault(s) before the voltage output $V_{OUT}$ 204 reaches the rated voltage (e.g., 1.8 V). More particularly still, in example cases the controller 242 drives each phase by asserting each drive terminal and tests for and/or detects the electrical fault(s) when the voltage output $V_{OUT}$ 204 is less than half the rated voltage (e.g., 0.9 V or less), and in some cases when the voltage output $V_{OUT}$ 204 is less than a quarter of the rated voltage (e.g., 0.45 V or less).

Figure 5:
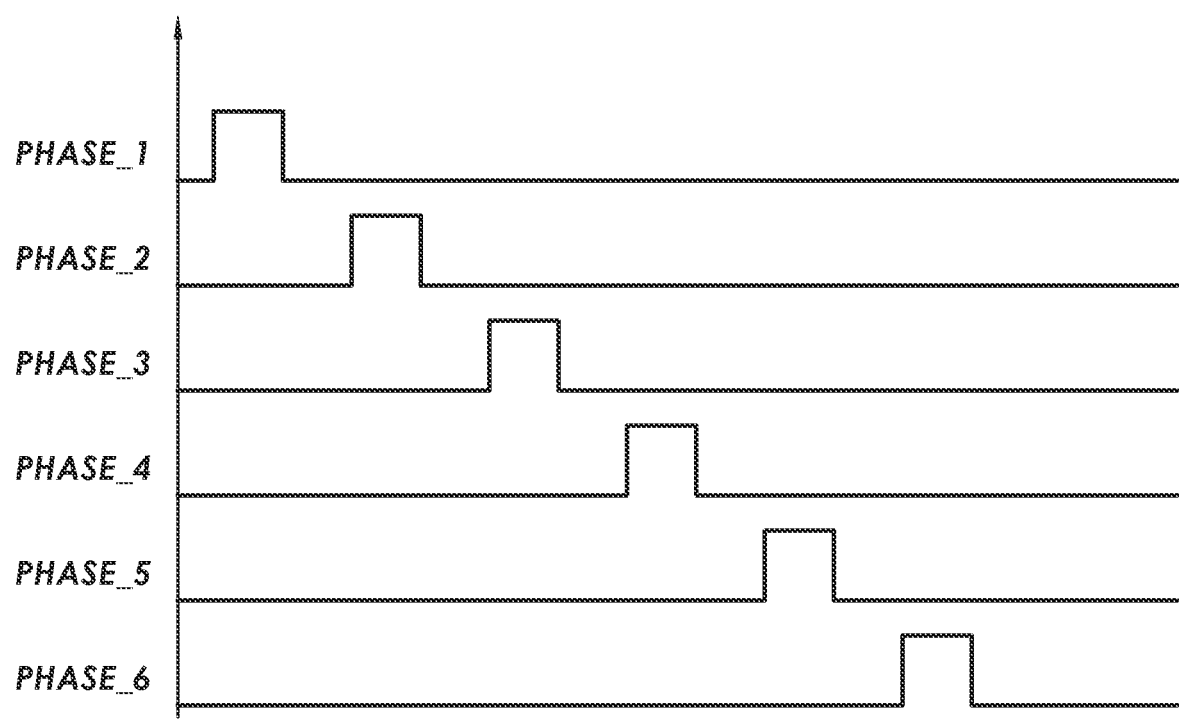
FIG. 5 shows a timing diagram for sequentially asserting the PWM input of each power stage module of a multiphase TLVR comprising six phases.
Figure 6:
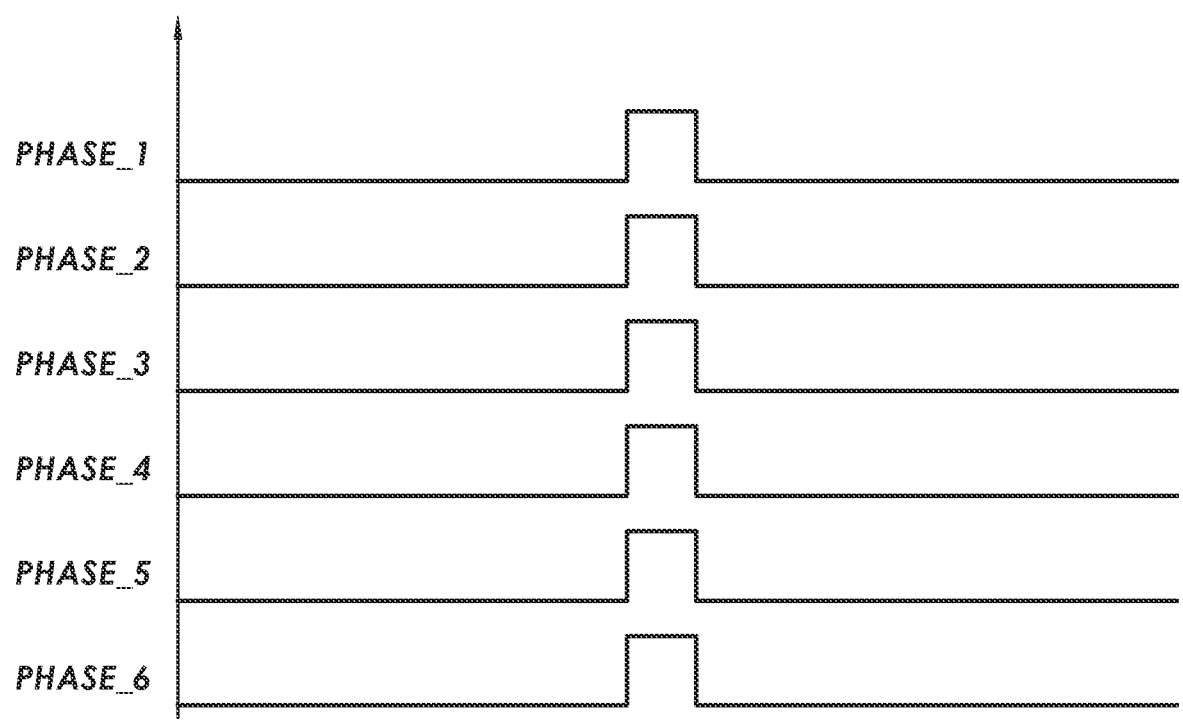
FIG. 6 shows a timing diagram for simultaneously asserting the PWM input of each power stage module of a multiphase TLVR comprising six phases.

Moreover, the example controller 242 may drive each phase by asserting each drive terminal in any suitable sequence. In some cases, the controller 242 is designed and constructed to drive each phase by asserting each drive terminal sequentially. FIG. 5 shows a timing diagram for sequentially asserting the PWM input of each power stage module (e.g., PWM input 232 of power stage module 222) of an example multiphase TLVR comprising six phases. It is noted that the sequential driving shown in FIG. 6 may be used during operation of the multiphase TLVR as well. In particular, in the example sequential driving, the controller 242 is designed and constructed to drive phase one individually by asserting (e.g., asserted high) the drive terminal and thus PWM input for phase one, placing the phase one into the charge mode. The controller 242 may then de-assert the drive terminal for the phase one, and then drive phase two individually by asserting the drive terminal and thus PWM input for phase two, placing the phase two into the charge mode. The process continues for all the example phases of the example multiphase TLVR. While discussed as sequential, it is noted that numbering of buck phases is arbitrary, and it is not required that "sequential" activation be of physically adjacent buck phases as laid out on the underlying PCB of the multiphase TLVR.

Figure 7:
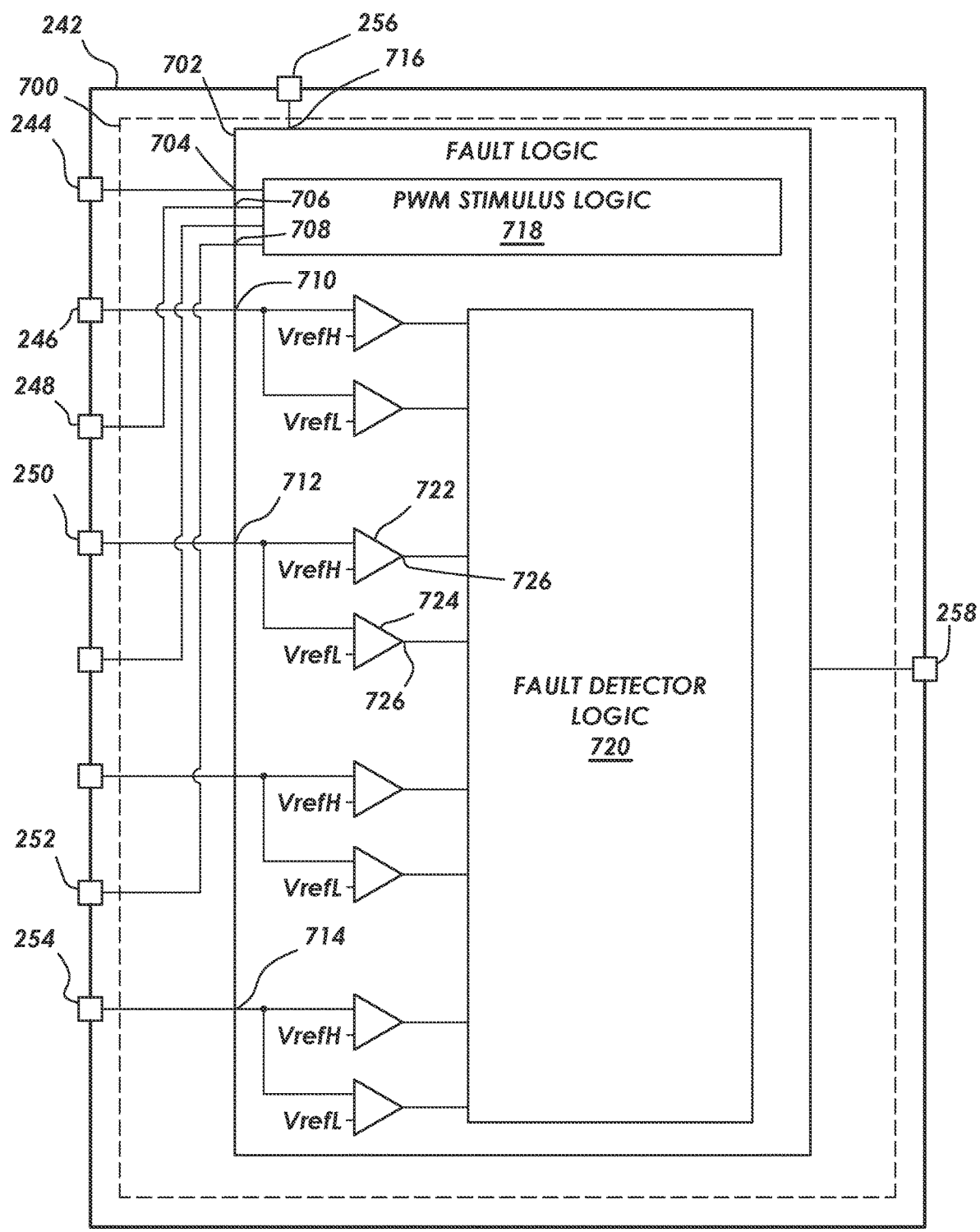
FIG. 7 shows a block diagram of a controller in accordance with at least some embodiments.

In yet still other cases, the controller 242 is designed and constructed to activate or drive two or more buck phases in parallel or simultaneously, and in one example drive all the buck phases simultaneously. FIG. 7 shows a timing diagram for simultaneously asserting the PWM input of each power stage module (e.g., PWM input 232 of power stage module 222) of an example multiphase TLVR comprising six phases. In particular, in the example simultaneous driving, the controller 242 is designed and constructed to drive two or more phases by asserting (e.g., asserted high) the drive terminals and thus PWM inputs for the phases, placing those phases into the charge mode. The controller 242 may then de-assert the drive terminals for the phases. As will be discussed in more detail below, certain of the electrical faults can be better detected with simultaneous driving of the two or more phases (e.g., Case F secondary open). Other cases may be detected with either simultaneous or sequential activation.

Table 1 below correlates the electrical fault cases discussed above, the testing stimulus that may be used to detect the electrical fault, and a symptom that manifests itself when the electrical fault is present. It is noted that Table 1 assumes only a single electrical fault present with a multiphase TLVR—example double faults are discussed below.

TABLE 1

| Case\Stimulus | Testing Stimulus | Symptom |
|---|---|---|
| Case A primary-to-secondary short | Parallel or Sequential | High current during charge mode on shorted phase. |
| Case B secondary short | Sequential | High current during charge mode on shorted phase. |
| Case C phase open | Parallel or Sequential | No phase current on open phase(s) |
| Case D primary-to-secondary short | Parallel | High current during charge mode on shorted phase(s). |
| Case E phase open | Parallel or Sequential | No phase current on open phase(s) |
| Case F secondary open | Parallel | Low phase current on all phases. |

In particular, in the Case A primary-to-secondary short, the current flow during the charge mode will be high. The Case D primary-to-secondary short effectively is tested and detected the same as Case A primary-to-secondary short, and thus Case D is not separately addressed. Cases A and D may be tested with either a parallel or sequential stimulus.

In the Case B secondary short, the current flow during the charge mode will be high. That is, because the secondary winding of the particular buck phase is shorted, the primary winding of the particular buck phase experiences only leakage inductance, and thus the buck phase tends to carry much higher current during the charge mode, and very little current during the discharge mode. Case B may be tested with the sequential stimulus.

In the Case C phase open, current flow during the charge mode will be low or zero. The Case E phase open may be tested with the either a parallel or sequential stimulus. The case E phase open effectively is tested and detected the same as the Case C phase open, and thus case E is not separately addressed.

The Case F secondary open may be tested with the parallel stimulus, and may manifest itself as low phase current on all the phases. Though in Table 1 the Case F secondary open is tested with the parallel stimulus, the Case F secondary open may also be tested and detected with a sequential stimulus, and manifests itself as all the buck phases having low current during their respective charge modes. The specification now turns to an example controller 242.

FIG. 7 shows a block diagram of an example controller 242. FIG. 7 shows that the controller 242 may comprise one or more substrates of semiconductor material (e.g., silicon), such as substrate 700, encapsulated within packaging. Bond pads or other connection points of the substrate 700 couple to the electrical terminals of the controller 242 (e.g., terminals 244, 246, 248, 250, 252, 254, 256, and 258). While a single substrate 700 is shown, in other cases multiple substrates may be combined to form the controller 242 (e.g., a multi-chip module), and thus showing a single substrate 700 shall not be construed as a limitation.

The example controller 242 includes a fault logic 702. The fault logic 702 may itself be implemented as a controller as that term is defined herein. The fault logic 702 defines a plurality of drive outputs coupled one each to the drive terminals. For example, the fault logic 702 defines a phase-one drive output 704 coupled to the phase-one drive terminal 244, a phase-two drive output 706 coupled to the phase-two drive terminal 248, and so on, through a phase-N drive output 708 coupled to the phase-N drive terminal 252. Again, while the example controller 242 is shown set up for coupling to four buck stages, the controller 242 may be designed and constructed to control two or more buck stages (e.g., four, five, six, eight, or ten). The example fault logic 702 further defines a plurality of sense inputs coupled one each to the sense terminals. For example, the fault logic 702 defines a phase-one sense input 710 coupled to the phase-one monitor terminal 246, a phase-two sense input 712 coupled to the phase-two monitor terminal 250, and so on, through a phase-N sense input 714 coupled to the phase-N monitor terminal 254.

Still referring to FIG. 7, the example fault logic 702 is designed and constructed to assert the phase-one drive output 704 and thus assert the phase-one drive terminal 244. As discussed above, asserting the phase-one drive terminal 244 places the first buck phase of the multiphase TLVR into the charge mode. During the charge mode of the first buck phase, the example fault logic 702 is designed and constructed to sense a signal indicative of current through the first phase, the sensing by way of the a phase-one monitor terminal 246 and phase-one sense input 710. The example fault logic 702 is further designed and constructed to assert the phase-two drive output 706 and thus assert the phase-two drive terminal 248. Asserting the phase-two drive terminal 248 places the second buck phase of the multiphase TLVR into the charge mode. During the charge mode the second buck phase, the example fault logic 702 is designed and constructed to sense a signal indicative of current through the second phase, the sending by way of the a phase-two monitor terminal 250 and phase-two sense input 712. The fault logic continues the process of asserting the drive terminals for all the phases of the multiphase TLVR, and those assertions may be sequential or in parallel as discussed above.

The example fault logic 702 is further designed and constructed to detect an electrical fault associated with any of the transformer modules of the multiphase TLVR, such as a phase-one transformer module associated with the phase-one drive terminal 244, or a phase-two transformer module associated with the phase-two drive terminal 248. In example cases, the fault logic 702 detects an electrical fault based on any one or multiple of the signals indicative of current received by way of the example sense terminals 246, 250, and 254. When the fault logic 702 detects an electrical fault, the fault logic 702 is designed and constructed to drive a fault indicator to the fault terminal 258. As discussed above, the fault indicator may be assertion of the Boolean signal, or may be sending of a message using the fault terminal 258 as a terminal of a communication channel (e.g., serial communication channel).

Still referring to FIG. 7, the example fault logic 702 further defines feedback input 716 coupled to the feedback terminal 256. In example cases, the fault logic 702 senses the voltage delivered during testing for and detecting electrical faults by way of the feedback terminal 256. It is noted that the feedback terminal 256 may also be used after the testing and detection to sense and control the voltage output $V_{OUT}$ 204. In example cases, the fault logic 702 of the controller 242 drives each phase by asserting each drive terminal and tests for and/or detects the electrical fault(s) when the voltage output $V_{OUT}$ 204 as sensed through the feedback terminal 256 is less than half the rated voltage (e.g., 0.9 V or less), and in some cases when the voltage output $V_{OUT}$ 204 as sensed through the feedback terminal 256 is less than a quarter of the rated voltage (e.g., 0.45 V or less).

The fault logic 702 of the example controller 242 may take any suitable form. FIG. 7 shows one example implementation. In particular, the example fault logic 702 defines a PWM stimuli logic 718, a fault detector logic 720, and a plurality of comparators. The example PWM stimuli logic 718 is designed and constructed to assert the various drive terminals in a particular sequence (e.g., parallel, sequential) at the discretion of the fault logic 702, and in some cases the PWM stimuli logic 718 may assert the drive terminals in both in parallel and sequentially in any one testing session. Further still, the PWM stimuli logic 718 may also be responsible for asserting the drive terminals during non-testing operations as well (e.g., when the multiphase TLVR is operational and provided the rated output voltage).

In example cases, for each phase of the multiphase TLVR, the example fault logic 702 implements a set of comparators. Referring to the second buck phase associated with the phase-two monitor terminal 250 as representative, the phase-two monitor terminal 250 is coupled to a high-current comparator 722 and a low-current comparator 724. The example low-current comparator 724 defines a first input coupled to the phase-two monitor terminal 250, and a second input coupled to a low-current reference voltage VrefL. Similarly, the example high-current comparator 722 defines a first input coupled to the phase-two monitor terminal 250, and a second input coupled to a high-current reference voltage VrefH. Thus, as the signal indicative of current received on the phase-two monitor terminal 250 rises from below and then through the low-current reference voltage VrefL, the compare output 726 of the low-current comparator 724 goes asserted. As the signal indicative of current received on the phase-two monitor terminal 250 continues to rise from below and then through the high-current reference voltage VrefH, the compare output 728 of the high-current comparator 722 goes asserted. Thus, in the example system the current sensed during each testing or detection phase is categorized, by the two comparators 722 and 724, into three zones. When the signal indicative of current remains below the VrefL, such is an indication of low or no current flow during the charge mode, and implying cases C, E, or F above. When the signal indicative of current rises above the VrefL but fails to rise through VrefH, such is an indication of expected current during the charge mode and an indication that no electrical faults are present on that phase. When the signal indicative of current rises through VrefH, such is an indication of high current during the charge mode, and implying cases A, B, or D above. Thus, the example fault detector 720 may sense and compare outputs of the comparators for each phase (e.g., representative phase two—compare outputs 726 and 728), and drive the fault terminal 258 with a fault signal when an electrical fault is detected on any of the phases.

Figure 8:
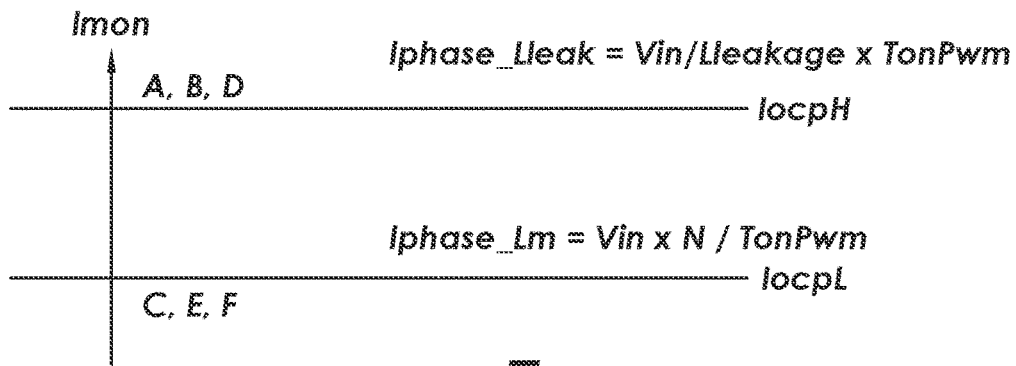
FIG. 8 shows a visual relationship of a phase current during a diagnostic test for the example electrical faults, in accordance with at least some embodiments.

FIG. 8 shows a visual relationship of a phase current during a diagnostic test. In particular, the vertical axis is designed as the monitored current Imon, being a signal indicative of current flow during the charge mode, and the horizontal axis may be considered time, though no plot of monitored current Imon over time is shown. During a diagnostic test, each set of comparators compares the phase current for that phase to the reference voltages. If the phase current fails to rise above the lower reference current Iocp_L (e.g. set using VrefL), then as shown the possible electrical faults affecting the particular phase may be cases C, E, and/or F. If the phase current rises above the lower reference current Iocp_L and the higher reference current Iocp_H (e.g., set by VrefH), then as shown the possible electrical faults affecting the particular phase may be cases A, B, and/or D. If the phase current rises above the lower reference current Iocp_L but stays below the higher reference current Iocp_H, then no faults are present on the particular phase.

FIG. 8 further shows an example set of equations correlating the reference currents to the three example zones defined by the two comparators for each phase. In particular, the lower reference current IocpL may be set based on the expected magnetizing inductance present when both primary and secondary windings are correctly connected and operational. The lower reference current IocpL may be calculated according to Equation (1):

$$I\text{phase\_Lm} = ((V_{IN} \times N)/Lm) \times TonPwm \quad (1)$$

where Iphase_Lm is the phase current in presence of the expected magnetizing inductance, $V_{IN}$ is the voltage input, N is the number of turns between the primary and secondary (in many cases a 1:1 transformer, so N=1), Lm is the expected magnetizing inductance in the absence of electrical faults, and TonPwm is the pulse width of the stimulus. The lower reference current IocpL may be selected to be slightly lower than the expected current in the presence of the expected magnetizing inductance Iphase_Lm. Relatedly, the upper reference current Iocp_H may be set based a phase experiencing only leakage inductance (e.g., the secondary is shorted). The upper reference current Iocp_H may be calculated according to Equation (2):

$$I\text{phase\_Lleak} = (V_{IN}/L\text{leakage}) \times TonPwm \quad (2)$$

where Iphase_Lleak is the phase current in presence of just the leakage inductance, Lleakage is the expected leakage inductance, and balance of the parameters are as defined above. The upper reference current IocpH may be selected to be slightly lower than the expected current when just leakage inductance is present, Iphase_Lleak. Using the calculated currents, the reference voltages VrefL and VrefH for the comparators may be determined.

The various embodiments discussed have assumed a single electrical fault of a multiphase TLVR, or multiple instances of the same electrical fault (e.g., multiple Case A primary-to-secondary shorts). However, in yet still other cases different types of electrical faults may be detected on a singular multiphase TLVR. Table 2 below correlates the multiple electrical fault cases, the testing stimulus that may be used to detect the multiple electrical faults, and along with a symptom that manifests itself when the electrical faults are present.

TABLE 2

| Case\Stimulus | Testing Stimulus | Symptom |
| --- | --- | --- |
| Case A primary-to-secondary short + Case F secondary open on different phase | Parallel | High current during charge mode on shorted phase(s), low current on phase(s) with secondary open. |
| Case B secondary short + Case F secondary open on different phase | Sequential | Low phase current. |
| Case C phase open + Case F secondary open on different phase | Parallel | Low (no) phase current on phase with open. |
| Case D primary-to-secondary short + Case F secondary open on different phase | Parallel | High current during charge mode on shorted phase(s), low current on phase with secondary open. |
| Case E phase open + Case F secondary open on different phase | Parallel | Low (no) phase current with open. |

In particular, in the Case A+F (i.e., primary-to-secondary short and secondary open), the current flow during the charge mode of the buck phase experiencing the short will be high. However, the remaining phases experience low current because of the open secondary. Case D+F effectively is tested and detected the same the same as Case A+F, and thus will not be separately addressed.

The Case B+F (i.e., secondary short on one phase but a secondary open on a different phase) may be tested with the sequential stimulus, and may manifest itself as high current during the charge mode of the phase with the Case B secondary short, but low current on the remaining phases. That is, for the buck phase with the secondary winding shorted, the primary winding experiences only leakage inductance, and thus the buck phase tends to carry much higher current during the charge mode, and very little current during the discharge mode. However, the remaining phases experience low current because of the open secondary.

The Case C+F (i.e., phase open on one phase but a secondary open on a different phase), as well as the Case E+F, may be tested with the a parallel stimulus. Because in Case C and Case E the buck phases carry no current, the combined electrical fault manifests itself as low or no current flow on all phases during the charge modes.

Figure 9:
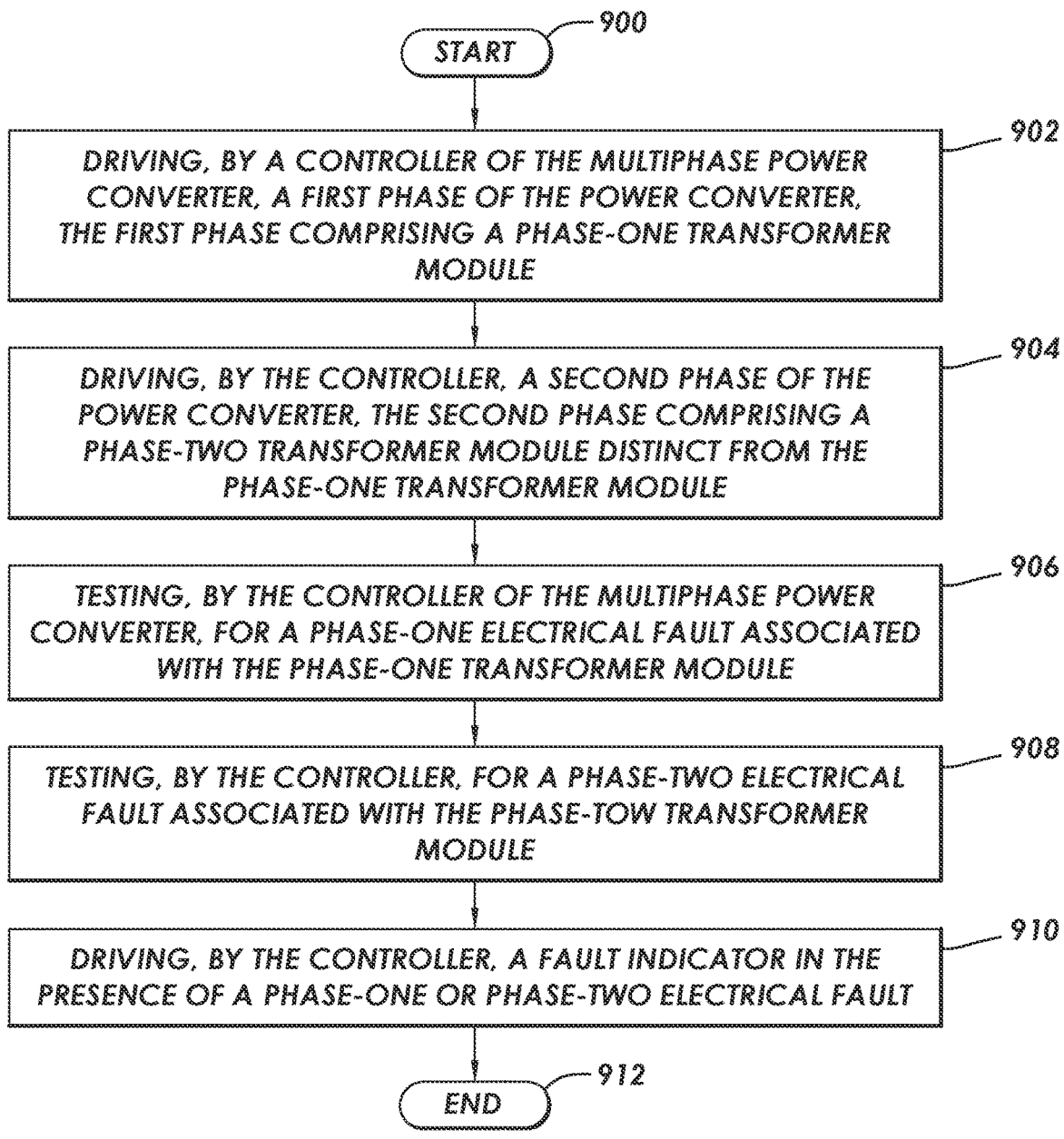
FIG. 9 shows a method in accordance with at least some embodiments.

FIG. 9 shows a method in accordance with at least some embodiments. In particular, the method starts (block 900) and comprises detecting electrical faults in a multiphase power converter by: driving, by a controller of the multiphase power converter, a first phase of the power converter, the first phase comprising a phase-one transformer module (block 902); driving, by the controller, a second phase of the power converter, the second phase comprising a phase-two transformer module distinct from the phase-one transformer module (block 904); testing, by the controller of the multiphase power converter, for a phase-one electrical fault associated with the phase-one transformer module (block 906); testing, by the controller, for a phase-two electrical fault associated with the phase-two transformer module (block 908); and driving, by the controller, a fault indicator in the presence of a phase-one or phase-two electrical fault (block 910). Thereafter, the methods ends (block 912), likely to be repeated or extended to the remaining phases of the multiphase TLVR.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of detecting electrical faults in a multiphase power converter, the method comprising:
    driving, by a controller of the multiphase power converter, a first phase of the multiphase power converter, the first phase comprising a phase-one transformer module;
    driving, by the controller, a second phase of the multiphase power converter, the second phase comprising a phase-two transformer module distinct from the phase-one transformer module;
    testing, by the controller of the multiphase power converter, for a phase-one electrical fault associated with the phase-one transformer module;
    testing, by the controller, for a phase-two electrical fault associated with the phase-two transformer module, wherein testing for the phase-one electrical fault and the phase-two electrical fault is conducted without measuring an AC portion of a respective phase current; and driving, by the controller, a fault indicator in the presence of a phase-one or phase-two electrical fault.

2. The method of claim 1 wherein driving the first phase and driving the second phase further comprises at least one selected from a group consisting of: driving when a voltage output of the multiphase power converter is less than half a rated voltage; and driving when the voltage output is less than a quarter of the rated voltage.

3. The method of claim 1 wherein testing for the phase-one electrical fault further comprises analyzing a signal indicative of current during a charge mode of the first phase.

4. The method of claim 1 wherein driving the first phase and driving the second phase further comprises driving the first phase and then driving the second phase.

5. The method of claim 4 wherein driving the fault indicator further comprises driving the fault indicator if the testing for the phase-one electrical fault indicates at least one selected from a group consisting of: a primary winding to a secondary winding short circuit; shorting of the secondary winding; and an open circuit on a primary side of the phase-one transformer module.

6. The method of claim 1 wherein driving the first phase and driving the second phase further comprises driving the first phase and simultaneously driving the second phase.

7. The method of claim 6 wherein driving the fault indicator further comprises driving the fault indicator if the testing for the phase-one electrical fault or the testing for the phase-two electrical fault indicate an open circuit on a secondary side of either the phase-one or phase-two transformer modules.

8. A controller for power converter, the controller comprising:
a phase-one drive terminal, a phase-one monitor terminal, a phase-two drive terminal, a phase-two monitor terminal, and a fault terminal;
a fault logic coupled to the phase-one drive terminal, the phase-one monitor terminal, the phase-two drive terminal, the phase-two monitor terminal, and the fault terminal;
the fault logic is configured to:
assert the phase-one drive terminal;
sense a phase-one signal indicative of current by way of the phase-one monitor terminal, wherein the fault logic is configured to sense the phase-one signal without measuring an AC portion of the current by way of the phase-one monitor terminal;
assert the phase-two drive terminal;
sense a phase-two signal indicative of current by way of the phase-two monitor terminal, wherein the fault logic is configured to sense the phase-one signal without measuring an AC portion of the current by way of the phase-one monitor terminal;
detect an electrical fault associated with a phase-one transformer module associated with the phase-one drive terminal, the detection based on the phase-one signal indicative of current; and
drive a fault indicator to the fault terminal.

9. The controller of claim 8 wherein when the fault logic detects the electrical fault, the controller is configured to at least one selected from a group consisting of: detect when a voltage output of the power converter is less than half a rated voltage; and detect when the voltage output is less than a quarter of the rated voltage.

10. The controller of claim 8 wherein when the fault logic senses the phase-one signal indicative of current, the controller is further configured to sense the phase-one signal indicative of current during a charge mode of a first phase of the power converter.

11. The controller of claim 8 wherein when the fault logic asserts the phase-one drive terminal and the phase-two drive terminal, the controller is further configured to assert the phase-one drive terminal and then assert the phase-two drive terminal.

12. The controller of claim 11 wherein when the fault logic drives the fault indicator, the controller is further configured to drive the fault indicator when the controller detects at least one selected from a group consisting of: a misplacement of the phase-one transformer module resulting in a short circuit between a phase-one primary winding and a phase-one secondary winding; a misplacement of the phase-one transformer module resulting in a short circuit across the phase-one secondary winding; and an incomplete solder joint resulting in an open circuit associate with a phase-one primary winding.

13. The controller of claim 8 wherein when the fault logic asserts the phase-one drive terminal and the phase-two drive terminal, the controller is further configured to assert the phase-one drive terminal and simultaneously assert the phase-two drive terminal.

14. The controller of claim 13 wherein when the fault logic drives the fault indicator, the controller is further configured to drive the fault indicator if the controller detects an open circuit on a phase-one secondary of the phase-one transformer module.

15. A method comprising:
driving, by a controller of a multiphase power converter, a first phase of the multiphase power converter into a charge mode, the first phase comprising a phase-one transformer module;
sensing, by the controller during the driving of the first phase, a phase-one signal indicative of current, wherein sensing the phase-one signal indicative of current is performed without measuring an AC portion of a phase-one current;
driving, by the controller, a second phase of the multiphase power converter into a charge mode, the second phase comprising a phase-two transformer module distinct from the phase-one transformer module;
sensing, by the controller during the driving of the second phase, a phase-two signal indicative of current, wherein sensing the phase-two signal indicative of current is performed without measuring an AC portion of a phase-two current;
detecting, by the controller, an electrical fault associated with the phase-one transformer module, the detection based on the phase-one signal indicative of current; and
driving, by the controller, a fault indicator.

16. The method of claim 15 wherein driving the first phase and driving the second phase comprises at least one selected from a group consisting of: driving when a voltage output of the multiphase power converter is less than half a rated voltage; and driving when the voltage output is less than a quarter of the rated voltage.

17. The method of claim 15 wherein driving the first phase and driving the second phase comprises driving the first phase simultaneously with driving the second phase.

18. The method of claim 15 wherein driving the first phase and driving the second phase comprises driving the first phase and then driving the second phase.

19. The method of claim 18 wherein driving the fault indicator comprises driving the fault indicator if the detecting indicates at least one selected from a group consisting of: a primary winding to a secondary winding short circuit of the phase-one transformer module; shorting of the secondary winding of the phase-one transformer module; and an open circuit of the primary winding of the phase-one transformer module.

20. The method of claim 15 wherein detecting comprises detecting without measuring a voltage or current on a secondary winding of either the phase-one transformer module or the phase-two transformer module.

* * * * *